US012656381B2

(12) United States Patent
Tsai et al.

(10) Patent No.: US 12,656,381 B2
(45) Date of Patent: Jun. 16, 2026

(54) SYSTEMS AND METHODS FOR DUTY CYCLE MEASUREMENT

(71) Applicant: Taiwan Semiconductor Manufacturing Company, Ltd., Hsinchu (TW)

(72) Inventors: Tsung-Hsien Tsai, Taoyuan County (TW); Ruey-Bin Sheen, Taichung City (TW); Chih-Hsien Chang, New Taipei City (TW); Cheng-Hsiang Hsieh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/767,283

(22) Filed: Jul. 9, 2024

(65) Prior Publication Data

US 2024/0361371 A1      Oct. 31, 2024

Related U.S. Application Data

(63) Continuation of application No. 17/124,580, filed on Dec. 17, 2020, now Pat. No. 12,066,476.

(Continued)

(51) Int. Cl.
*G01R 29/02* (2006.01)
*G01R 25/00* (2006.01)
(Continued)

(52) U.S. Cl.
CPC ......... *G01R 29/023* (2013.01); *G01R 25/005* (2013.01); *H03K 3/037* (2013.01);
(Continued)

(58) Field of Classification Search
CPC ...... G01R 29/023; G01R 25/005; H03K 5/00; H03K 19/21
See application file for complete search history.

(56) References Cited

U.S. PATENT DOCUMENTS 7,414,451 B2 * 8/2008 Lee .......................... G11C 7/22
327/295
7,423,465 B2 9/2008 Gomm
(Continued)

FOREIGN PATENT DOCUMENTS

| TW | 201621326 | 6/2016 |
| TW | 202228396 | 7/2022 |

OTHER PUBLICATIONS

Taiwan Office Action; Application No. 112116889; Dated Mar. 6, 2024.

(Continued)

*Primary Examiner* — Menatoallah Youssef
*Assistant Examiner* — Khareem E Almo
(74) *Attorney, Agent, or Firm* — Jones Day

(57) ABSTRACT

Systems, methods, and circuits for determining a duty cycle of a periodic input signal are provided. A delay element is configured to delay the periodic input signal based on a digital control word. A digital circuit is configured to generate a first digital control word used to delay the periodic input signal a first amount of time corresponding to a period of the periodic input signal, generate a second digital control word used to delay the periodic input signal a second amount of time corresponding to a portion of the periodic input signal having a logic-level high value, and generate a third digital control word used to delay the periodic input signal a third amount of time corresponding to a portion of the periodic input signal having a logic-level low value. A (Continued)

controller is configured to determine the duty cycle based on the first, second, and third digital control words.

20 Claims, 7 Drawing Sheets

Related U.S. Application Data

(60) Provisional application No. 62/982,176, filed on Feb. 27, 2020.

(51) Int. Cl.
| | | |
|---|---|---|
| *H03K 3/037* | (2006.01) | |
| *H03K 5/00* | (2006.01) | |
| *H03K 19/21* | (2006.01) | |

(52) U.S. Cl.
CPC .............. *H03K 5/00* (2013.01); *H03K 19/21* (2013.01); *H03K 2005/00058* (2013.01)

(56) References Cited

U.S. PATENT DOCUMENTS

| | | | | |
|---|---|---|---|---|
| 7,479,777 | B2 * | 1/2009 | Kelkar | G01R 31/31727 |
| | | | | 324/76.62 |
| 7,675,336 | B1 * | 3/2010 | Foo | H03K 5/1565 |
| | | | | 327/158 |
| 8,344,925 | B1 * | 1/2013 | Evans | H03M 1/462 |
| | | | | 341/120 |
| 9,372,499 | B2 * | 6/2016 | Sambamurthy | H03K 19/20 |
| 9,590,637 | B1 * | 3/2017 | Lau | H03K 21/10 |
| 9,692,403 | B2 | 6/2017 | Elbadry | |
| 10,727,826 | B2 * | 7/2020 | Choi | G11C 7/222 |
| 10,840,896 | B2 * | 11/2020 | Chae | H03K 5/135 |
| 2008/0162062 | A1 * | 7/2008 | Kelkar | G01R 31/31727 |
| | | | | 702/79 |
| 2012/0154006 | A1 * | 6/2012 | Ahn | H03K 5/1565 |
| | | | | 327/175 |
| 2012/0314833 | A1 * | 12/2012 | Venkatasubramanian | |
| | | | | G06F 12/0815 |
| | | | | 377/48 |
| 2013/0119951 | A1 * | 5/2013 | Sreenivas | H02M 3/157 |
| | | | | 323/234 |
| 2013/0176062 | A1 * | 7/2013 | Wang | H03K 5/133 |
| | | | | 327/161 |
| 2013/0182816 | A1 * | 7/2013 | Skripek | H03K 23/42 |
| | | | | 377/47 |
| 2013/0258731 | A1 | 10/2013 | Xu | |
| 2016/0079971 | A1 * | 3/2016 | Singh | G11C 29/028 |
| | | | | 327/276 |
| 2019/0149141 | A1 * | 5/2019 | Hsieh | H03B 5/1228 |
| | | | | 327/116 |
| 2019/0190505 | A1 * | 6/2019 | Yi | H03K 5/14 |
| 2022/0014205 | A1 * | 1/2022 | Petrov | H03L 7/1974 |
| 2023/0096760 | A1 | 3/2023 | Bowman | |

OTHER PUBLICATIONS

Nikolić et al.; Improved Sense-Amplifer-Based Flip-Flop: Design and Measurements; IEEE Journal of Solid-State Circuits, 35(6); pp. 876-884; Jun. 2000.

* cited by examiner

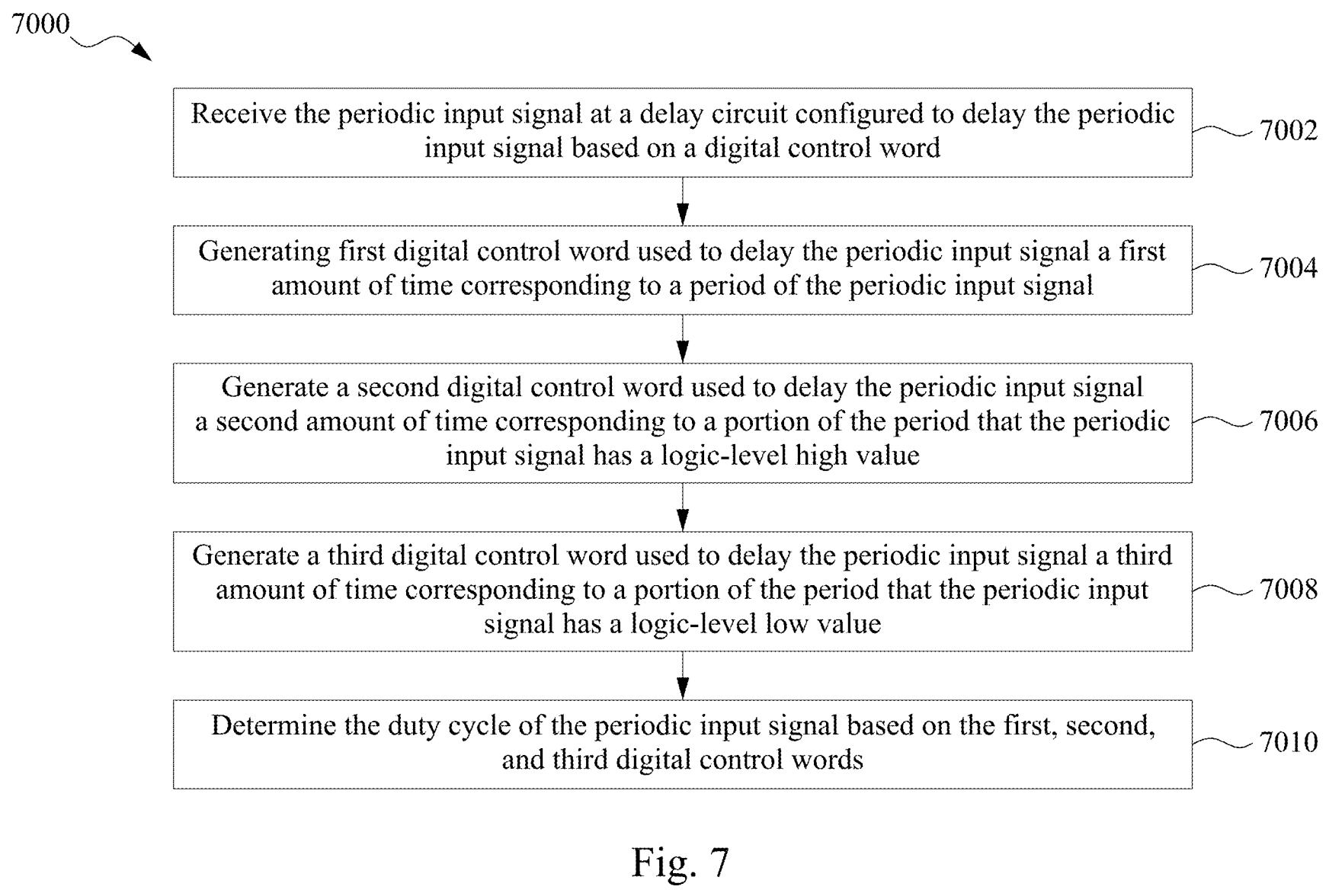

7000

7002 — Receive the periodic input signal at a delay circuit configured to delay the periodic input signal based on a digital control word 7004 — Generating first digital control word used to delay the periodic input signal a first amount of time corresponding to a period of the periodic input signal 7006 — Generate a second digital control word used to delay the periodic input signal a second amount of time corresponding to a portion of the period that the periodic input signal has a logic-level high value 7008 — Generate a third digital control word used to delay the periodic input signal a third amount of time corresponding to a portion of the period that the periodic input signal has a logic-level low value 7010 — Determine the duty cycle of the periodic input signal based on the first, second, and third digital control words

Fig. 7

SYSTEMS AND METHODS FOR DUTY CYCLE MEASUREMENT

CROSS-REFERENCE TO RELATED APPLICATIONS

This application is a continuation application of U.S. patent application Ser. No. 17/124,580, entitled "Systems and Methods for Duty Cycle Measurement," filed Dec. 17, 2020, which claims priority from U.S. Provisional Application No. 62/982,176, filed Feb. 27, 2020, entitled "All Digital Solution for Duty-Cycle Measurement and Process Indicator," the contents of each of which are incorporated herein by reference in their entirety.

BACKGROUND

Duty cycle refers to the percentage of time that a periodic digital signal exhibits a high state during a full signal cycle or period. For example, a signal that exhibits a logic high state for 50% of the signal period has a 50% duty cycle. Similarly, for instance, a signal that exhibits a logic high state for 40% of a signal period has a 40% duty cycle.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 7 depicts operations of an example method for determining a duty cycle of a periodic input signal, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
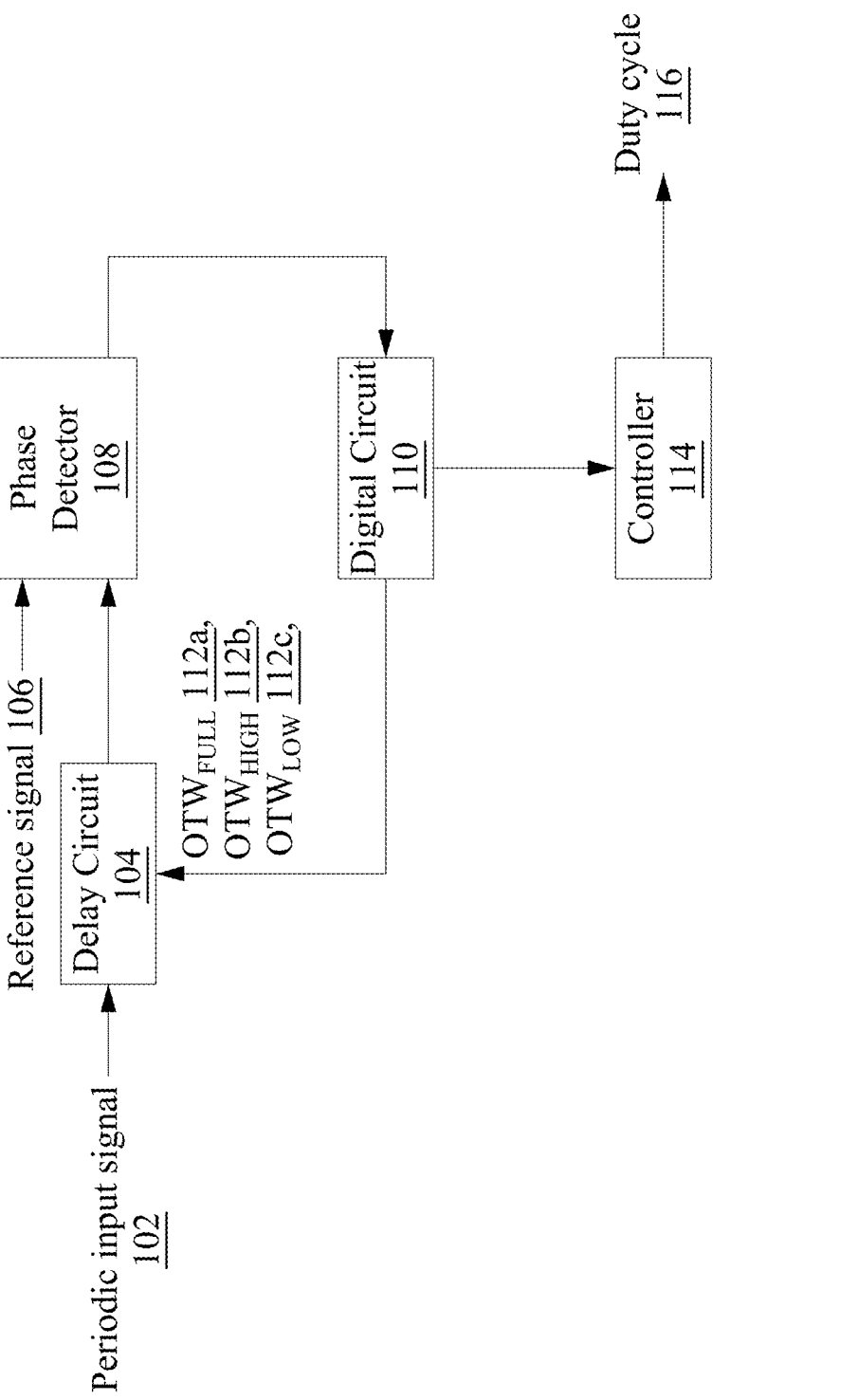
FIG. 1 depicts a block diagram of a circuit for determining a duty cycle of a periodic input signal, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

Duty cycle refers to the percentage of time that a periodic digital signal exhibits a high state during a full signal cycle or period. It can be challenging to monitor a relatively fast periodic signal (e.g., a multi-GHz signal) and determine its duty cycle via direct measurements. These challenges may result from bandwidth limitations of test equipment and associated accessories, such as cables.

Conventional solutions to determining the duty cycle of a periodic signal are often based in analog technology. In some of the conventional solutions, the periodic signal is converted into a current using an analog circuit, and then the current is converted into a voltage using a low-bandwidth filter or other analog circuitry. The voltage of the signal is measured, and the duty cycle for the periodic signal can be determined based on the measured voltage. A problem with the conventional methods is that the analog circuits used to generate the currents can introduce distortions and inaccuracies into the measurements. These distortions and inaccuracies are especially problematic when the periodic signal is relatively fast (e.g., in the GHz range). The conventional solutions also often require an analog-to-digital converter (ADC) to convert the analog voltages to digital values, which can introduce additional error and inaccuracy into the duty cycle determination. Further, the conventional solutions are also inconvenient because they often require an analog voltage meter to perform the voltage measurements, and such analog voltage meters require additional space and cost.

The approaches of the instant disclosure enable the determination of duty cycles of periodic signals in a manner that is more accurate than the conventional solutions. For example, as explained below, the approaches of the instant disclosure account for unknown variables in the duty cycle determination that can otherwise cause inaccuracies in the calculation. In some embodiments, duty cycles are determined using a delay locked loop (DLL) that delays the periodic signal based on digital control words received from digital circuitry. In addition to being more accurate than the conventional solutions, the approaches of the instant disclosure are also more convenient, space-efficient, and cost-effective because they do not require the use of an analog voltage meter and other components that consume circuit space and add additional cost. These advantages and others of the instant disclosure are described in detail below.

FIG. 1 is a block diagram of a circuit for determining a duty cycle 116 of a periodic input signal 102, in accordance with some embodiments. As seen in this figure, the circuit includes a delay circuit 104 that receives the periodic input signal 102. In some embodiments, the delay circuit 104 includes a DLL as described in further detail below. The delay circuit 104 is configured to delay the periodic input signal 102 based on digital control words received from a digital circuit 110. Specifically, the delay circuit 104 delays the periodic input signal 102 based on a first digital control word $OTW_{FULL}$ 112a, a second digital control word $OTW_{HIGH}$ 112b, and a third digital control word $OTW_{LOW}$ 112c, as shown in FIG. 1.

In some embodiments, the digital circuit 110 generates the three distinct digital control words $OTW_{FULL}$ 112a, $OTW_{HIGH}$ 112b, and $OTW_{LOW}$ 112c that cause the delay circuit 104 to delay the periodic input signal 102 by three different amounts of time. The first digital control word $OTW_{FULL}$ 112a generated by the digital circuit 110 causes the delay circuit 104 to delay the periodic input signal 102 by a first amount of time that corresponds to a full period of the periodic input signal 102. The second digital control word $OTW_{HIGH}$ 112b generated by the digital circuit 110 causes the delay circuit 104 to delay the periodic input signal 102 by a second amount of time that corresponds to a portion of the period that the periodic input signal 102 has a logic-level high value. The third digital control word $OTW_{LOW}$ 112c generated by the digital circuit 110 causes the delay circuit 104 to delay the periodic input signal 102 by a third amount of time that corresponds to a portion of the period that the periodic input signal 102 has a logic-level low value.

A phase detector 108 generates signals that are used by the digital circuit 110 in generating the first digital control word $OTW_{FULL}$ 112a, the second digital control word $OTW_{HIGH}$ 112b, and the third digital control word $OTW_{LOW}$ 112c. Specifically, as seen in FIG. 1, the phase detector 108 receives (i) a reference signal 106 that is equivalent to the periodic input signal 102, and (ii) a delayed version of the periodic input signal 102 from the delay circuit 104. The phase detector 108 determines when an edge (e.g., a rising edge, a falling edge) of the reference signal 106 is aligned with an edge of the delayed version of the periodic input signal 102 and outputs a signal to the digital circuit 110 that is indicative of the alignment or lack thereof. The digital circuit 110 generates the first digital control word $OTW_{FULL}$ 112a, the second digital control word $OTW_{HIGH}$ 112b, and the third digital control word $OTW_{LOW}$ 112c based on the signals received from the phase detector 108.

The output of the phase detector 108 thus provides a feedback loop to the digital circuit 110 that enables the digital circuit 110 to modify the first digital control word $OTW_{FULL}$ 112a, the second digital control word $OTW_{HIGH}$ 112b, and the third digital control word $OTW_{LOW}$ 112c until the periodic input signal 102 has been delayed the correct amount of time. For instance, in generating the first digital control word $OTW_{FULL}$ 112a, the digital circuit 110 can modify the control word based on feedback from the phase detector 108 until a control word that results in the delay circuit 104 delaying the periodic input signal 102 by the first amount of time is determined. Likewise, in generating the second digital control word $OTW_{HIGH}$ 112b, the digital circuit 110 can modify the control word based on feedback from the phase detector 108 until a control word that results in the delay circuit 104 delaying the periodic input signal 102 by the second amount of time is determined. Similarly, in generating the third digital control word $OTW_{LOW}$ 112c, the digital circuit 110 can modify the control word based on feedback from the phase detector 108 until a control word that results in the delay circuit 104 delaying the periodic input signal 102 by the third amount of time is determined.

Figures 2A, 2B, 2C:
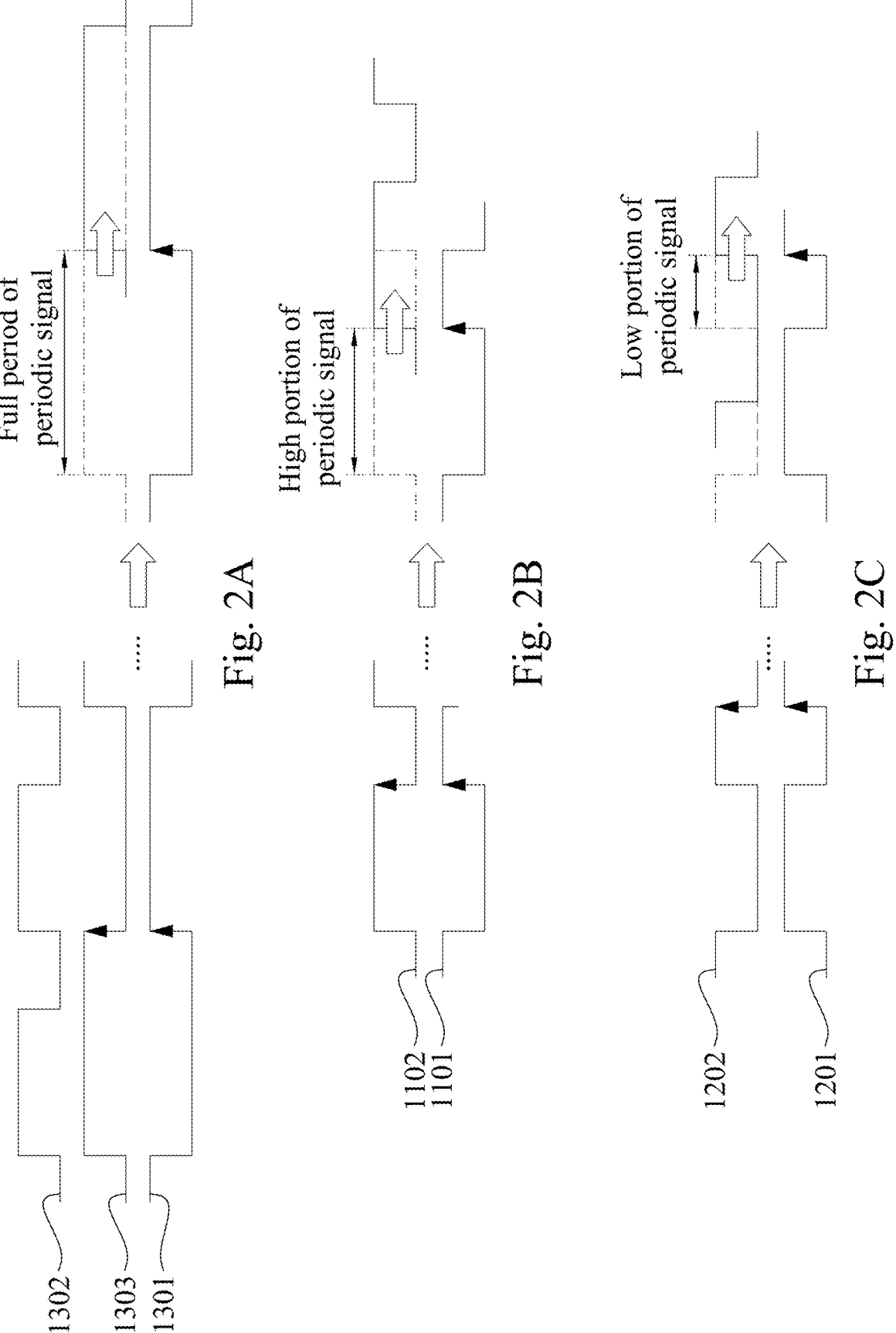
FIG. 2A depicts a first waveform representative of a periodic input signal and a second waveform representative of an output of a divider circuit, in accordance with some embodiments.
FIG. 2B depicts a first waveform representative of a periodic input signal and a second waveform representative of an output of an inverter circuit, in accordance with some embodiments.
FIG. 2C depicts a first waveform representative of an inverted version of a periodic input signal and a second waveform representative of an inverted version of the first waveform, in accordance with some embodiments.

In some embodiments, to generate the first digital control word $OTW_{FULL}$ 112a that causes the periodic input signal 102 to be delayed the first amount of time, a divider circuit is utilized. FIG. 2A shows (i) a waveform 1302 representative of the periodic input signal 102, (ii) a waveform 1303 representative of an output of the divider circuit, where the divider circuit divides the periodic input signal 102 by two (2) to generate the slower waveform 1303, and (iii) a waveform 1301 representative of an inverted version of the waveform 1303. In the example of FIG. 2A, after one or more cycles, rising edges of the waveform 1301 and the waveform 1303 are aligned, indicating that the periodic input signal 102 has been delayed the first amount of time corresponding to the full period of the periodic input signal 102. The phase detector 108 of FIG. 1 detects this alignment of edges and generates an appropriate output signal that is received by the digital circuit 110. The first digital control word $OTW_{FULL}$ 112a is the digital control word that causes the alignment between the edges of waveforms 1301, 1303 as seen in FIG. 2A. Divider circuits that can be used in generating the waveforms 1301, 1302 are described below with reference to FIG. 3.

In some embodiments, to generate the second digital control word $OTW_{HIGH}$ 112b that causes the periodic input signal 102 to be delayed the second amount of time, an inverter circuit is utilized. FIG. 2B shows (i) a waveform 1102 representative of the periodic input signal 102, and (ii) a waveform 1101 representative of an output of the inverter circuit, where the inverter circuit inverts the periodic input signal 102 to generate the waveform 1101. As further shown in FIG. 2B, after one or more cycles, rising edges of the waveform 1102 and the waveform 1101 are aligned, indicating that the periodic input signal 102 has been delayed the second amount of time corresponding to the portion of the periodic input signal 102 that has the logic-level high value. The phase detector 108 of FIG. 1 detects this alignment of edges and generates an appropriate output signal that is received by the digital circuit 110. The second digital control word $OTW_{HIGH}$ 112b is the digital control word that causes the alignment between the waveforms 1101, 1102 as seen in FIG. 2B. Inverter circuits that can be used in generating the waveform 1101 are described below with reference to FIG. 3.

In some embodiments, to generate the third digital control word $OTW_{LOW}$ 112c that causes the periodic input signal 102 to be delayed the third amount of time, multiple inverter circuits are utilized. FIG. 2C shows (i) a waveform 1202 representative of an inverted version of the periodic input signal 102, and (ii) a waveform 1201 representative of an inverted version of the waveform 1202. As further shown in FIG. 2C, after one or more cycles, rising edges of the waveform 1201 and the waveform 1202 are aligned, indicating that the periodic input signal 102 has been delayed the third amount of time corresponding to the portion of the periodic input signal 102 having the logic-level low value. The phase detector 108 of FIG. 1 detects this alignment of edges and generates an appropriate output signal that is received by the digital circuit 110. The third digital control word $OTW_{LOW}$ 112c is the digital control word that causes the alignment between the waveforms 1201, 1202 seen in FIG. 2C. Inverter circuits that can be used in generating the waveforms 1201, 1202 are described below with reference to FIG. 3.

With reference again to FIG. 1, a controller 114 receives the first digital control word $OTW_{FULL}$ 112a, the second digital control word $OTW_{HIGH}$ 112b, and the third digital control word $OTW_{LOW}$ 112c and determines the duty cycle 116 of the periodic input signal 102 based on these three digital control words. Specifically, in some embodiments, the controller 114 determines the duty cycle 116 by solving Equation 1:

$$\frac{OTW_{FULL} - OTW_{LOW}}{2 \times OTW_{FULL} - OTW_{HIGH} - OTW_{LOW}}, \quad \text{(Equation 1)}$$

where $OTW_{FULL}$ is the first digital control word 112a, $OTW_{HIGH}$ is the second digital control word 112b, and $OTW_{LOW}$ is the third digital control word 112c.

In some embodiments, the delay circuit 104 is configured to delay the periodic input signal 102 in accordance with a step size $\Delta T$ representing a minimum incremental amount of delay that can be applied by the delay circuit 104. The step size $\Delta T$ of a delay circuit (e.g., a DLL-based delay circuit, as described herein) is generally an unknown value that cannot be controlled in the fabrication process. However, in embodiments of the present disclosure, the controller 114 is configured to determine the step size $\Delta T$ of the delay circuit 104 based on the duty cycle 116 and the digital control words $OTW_{FULL}$ 112a, $OTW_{HIGH}$ 112b, and $OTW_{LOW}$ 112c. Specifically, in some embodiments, the controller determines the step size $\Delta T$ by solving Equation 2:

$$\frac{1}{F_{DUT} \times (2 \times OTW_{FULL} - OTW_{HIGH} - OTW_{LOW})}, \quad \text{(Equation 2)}$$

where $F_{DUT}$ represents a frequency corresponding to the duty cycle (e.g., the duty cycle divided by the pulse width of the periodic input signal 102), $OTW_{FULL}$ represents the first digital control word 112a, $OTW_{HIGH}$ represents the second digital control word 112b, and $OTW_{LOW}$ represents the third digital control word 112c. The step size $\Delta T$ determined by solving Equation 2 may provide useful process information (e.g., the step size $\Delta T$ may serve as a process indicator indicative of one or more processes used in forming the component for which a duty cycle is being measured).

Equations 1 and 2, used by the controller 114 in calculating the duty cycle 116 and step size $\Delta T$, respectively, can be determined as follows. As explained above, the first digital control word $OTW_{FULL}$ 112a causes the delay circuit 104 to delay the periodic input signal 102 the first amount of time corresponding to the full period of the periodic input signal 102. The relationship between the first amount of time and the first digital control word $OTW_{FULL}$ 112a can be represented by Equation 3:

$$Full = intr_{dly} + (\Delta T)(OTW_{FULL}), \quad \text{(Equation 3)}$$

where Full is the first amount of time, $intr_{dly}$ is an intrinsic delay of the delay circuit 104, $OTW_{FULL}$ is the first digital control word 112a, and $\Delta T$ is the step size described above. In embodiments where the delay circuit 104 uses a delay train or other types of delay elements (e.g., delay elements containing logic gates, etc.), the $intr_{dly}$ term represents the intrinsic delay of such delay elements. The intrinsic delay $intr_{dly}$ and the step size $\Delta T$ are both non-controllable, unknown parameters in silicon. In order to accurately calculate the duty cycle 116, embodiments of the present disclosure remove the $intr_{dly}$ and $\Delta T$ terms via mathematical manipulation, as described below.

The second digital control word $OTW_{HIGH}$ 112b causes the delay circuit 104 to delay the periodic input signal 102 the second amount of time corresponding to the portion of the period that the periodic input signal 102 has a logic-level high value, as explained above. The relationship between the second amount of time and the second digital control word $OTW_{HIGH}$ can be represented by Equation 4:

$$Hi = intr_{dly} + (\Delta T)(OTW_{HIGH}), \quad \text{(Equation 4)}$$

where Hi is the second amount of time, $intr_{dly}$ is the intrinsic delay of the delay circuit 104, $OTW_{HIGH}$ is the second digital control word 112b, and $\Delta T$ is the step size described above.

The third digital control word $OTW_{LOW}$ 112c causes the delay circuit 104 to delay the periodic input signal 102 the third amount of time corresponding to the portion of the period that the periodic input signal 102 has a logic-level low value. The relationship between the third amount of time and the third digital control word $OTW_{LOW}$ can be represented by Equation 5:

$$Lo = intr_{dly} + (\Delta T)(OTW_{LOW}) \quad \text{(Equation 5)}$$

where Lo is the third amount of time, $intr_{dly}$ is the intrinsic delay of the delay circuit 104, $OTW_{LOW}$ is the third digital control word 112c, and $\Delta T$ is the step size as described above.

The $intr_{dly}$ term can be removed by manipulating Equations 3-5 using subtraction operations:

$$Hi' = \text{Full} - Lo = (\Delta T)(OTW_{FULL} - OTW_{LOW}), \quad \text{(Equation 6)}$$

$$Lo' = \text{Full} - Hi = (\Delta T)(OTW_{FULL} - OTW_{HIGH}), \quad \text{(Equation 7)}$$

$$\text{(Equation 8)}$$

$$\text{Full}' = Hi' + Lo' = (\Delta T)((2^* OTW_{FULL}) - OTW_{HIGH} - OTW_{LOW}),$$

As seen above, Equation 8 represents the first amount of time (i.e., an amount of time equal to a full period of the periodic input signal 102) but does not depend on the intrinsic delay term $intr_{dly}$. Likewise, Equations 6 and 7 represent the second and third amounts of time, respectively, but do not depend on the intrinsic delay term $intr_{dly}$. Accordingly, Equations 6-8 show that the intrinsic delay term $intr_{dly}$ has been removed by mathematical manipulation. Further, with the intrinsic delay term $intr_{dly}$ removed, Equations 6-8 are free of process, voltage, and temperature (PVT) artifact fluctuations.

Equation 1, used in calculating the duty cycle 116, can be derived by dividing Equation 6 by Equation 8:

$$\text{Duty} = \frac{Hi'}{\text{Full}'} = \frac{OTW_{FULL} - OTW_{LOW}}{2 \times OTW_{FULL} - OTW_{HIGH} - OTW_{LOW}} \quad \text{(Equation 9)}$$

As seen above, by dividing the equations for Hi' by Full', the step size term $\Delta T$ is removed via the division operation. This is evident from Equation 1, above, which enables the calculation of the duty cycle 116 using only the digital control words $OTW_{FULL}$ 112a, $OTW_{HIGH}$ 112b, and $OTW_{LOW}$ 112c, and does not depend on the step size term $\Delta T$. After the duty cycle 116 is determined, the step size term $\Delta T$ can be calculated via Equation 2 to obtain useful process information, as explained above.

As is further explained below with reference to FIGS. 3-6, embodiments of the instant disclosure utilize a DLL to delay a periodic input signal by the three amounts of time described above (i.e., a first amount of time that corresponds to a full period of the periodic input signal, a second amount of time that corresponds to a portion of the period that the periodic input signal has a logic-level high value, and a third amount of time that corresponds to a portion of the period that the periodic input signal has a logic-level low value). In some embodiments, the three amounts of delay time are achieved using three different patterns of signals generated by a pattern generator. A controller processes the digital control words $OTW_{FULL}$, $OTW_{HIGH}$, and $OTW_{LOW}$ to determine the duty cycle and the step size $\Delta T$. Further, embodiments of the present disclosure use mathematical operations as detailed above to remove uncertainty terms (e.g., intrinsic delay of the DLL, step size $\Delta T$), thus enabling the calculation of duty cycle in a manner that is more accurate than previous approaches.

Embodiments described below with reference to FIGS. 3-6 implement the approaches of the instant disclosure via low complexity circuits that enable easy process migration. The low complexity circuits described herein include components (e.g., delay train, XOR gate, D flip flops, and dividers) that can be easily fabricated and designed. Portions of the example architectures described herein may be created via register level transfer (RTL) design and then implemented by auto place and route (APR). Further, as detailed herein, embodiments of the instant disclosure provide the measured results of duty cycle and process information (e.g., step size $\Delta T$) in a digital format. The digital output provides efficiency and convenience for automatic test equipment (ATE) testing and digital signal processing (DSP). Other advantages of the instant approaches are explained throughout this disclosure.

Figure 3:
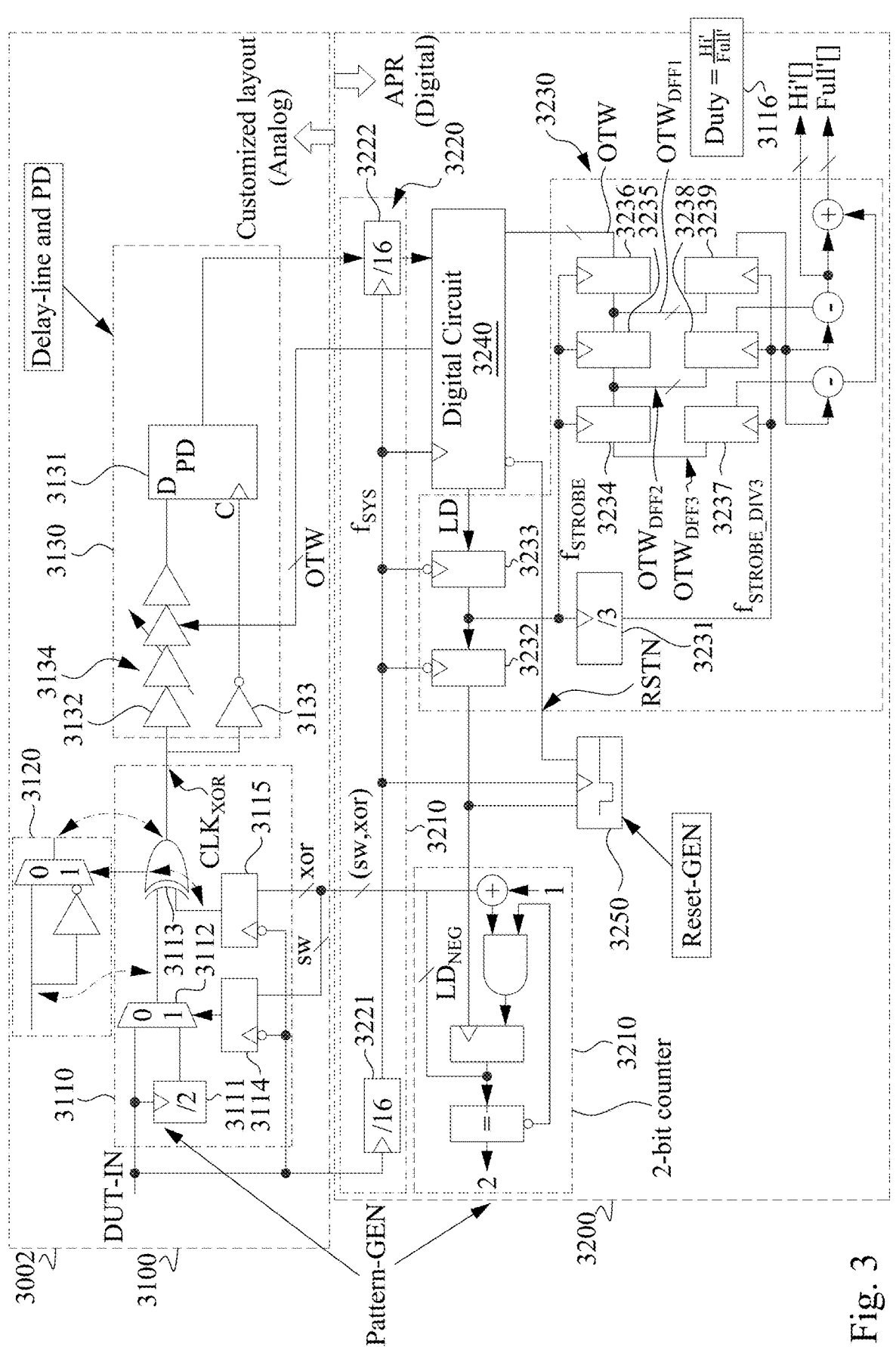
FIG. 3 depicts a schematic diagram of a circuit for determining a duty cycle of a periodic input signal, in accordance with some embodiments.

FIG. 3 is a schematic diagram of a circuit for determining a duty cycle 3116 of a periodic input signal 3002, in accordance with some embodiments. The circuit of FIG. 3 includes components that implement one or more of the functionalities discussed above with reference to FIGS. 1, 2a, 2b, and 2c. The periodic input signal 3002 is labeled "DUT-IN" in this figure, reflecting the fact that the periodic input signal 3002 may in some instances be a periodic signal generated by a device under test (DUT). However, the embodiments of the instant disclosure are not limited to scenarios where the periodic input signal is generated by a DUT. As seen in FIG. 3, the circuit includes a delay locked loop (DLL) having a delay train 3134 and phase detector 3131. The delay train 3134 is configured to delay the periodic input signal 3002 based on digital control words (labeled "OTW" in FIG. 3) generated by a digital circuit 3240.

In some embodiments, the digital control words generated by the digital circuit 3240 include the three distinct digital control words $OTW_{FULL}$, $OTW_{HIGH}$, and $OTW_{LOW}$ described above with reference to FIGS. 1, 2a, 2b, and 2c. A first digital control word $OTW_{FULL}$ generated by the digital circuit 3240 causes the delay train 3134 to delay the periodic input signal 3002 by a first amount of time that corresponds to a period of the periodic input signal 3002. The second digital control word $OTW_{HIGH}$ generated by the digital circuit 3240 causes the delay train 3134 to delay the periodic input signal 3002 a second amount of time that corresponds to a portion of the period that the periodic input signal 3002 has a logic-level high value. The third digital control word $OTW_{LOW}$ generated by the digital circuit 3240 causes the delay train 3134 to delay the periodic input signal 3002 a third amount of time that corresponds to a portion of the period that the periodic input signal 3002 has a logic-level low value.

The circuit of FIG. 3 uses digital signals Sw, Xor to determine which of the first, second, and third digital control words (e.g., $OTW_{FULL}$, $OTW_{HIGH}$, or $OTW_{LOW}$) is being generated at a given time:

| {Sw, Xor} | Functions |
|---|---|
| {0 0} | Measuring high period of period clock signal |
| {0 1} | Measuring low period of period clock signal |
| {1 0} | Measuring full period of period clock signal |

As shown in the table above, when Sw=1 and Xor=0, the first digital control word $OTW_{FULL}$ used in delaying the periodic input signal 3002 the first amount of time is generated. When Sw=0 and Xor=0, the second digital control word $OTW_{HIGH}$ used in delaying the periodic input signal 3002 the second amount of time is generated. When Sw=0 and Xor=1, the third digital control word $OTW_{LOW}$ used in delaying the periodic input signal 3002 the third amount of time is generated. Accordingly, by progressing through the different combinations of Sw and Xor, the circuit of FIG. 3 can generate the digital control words $OTW_{FULL}$, $OTW_{HIGH}$, and $OTW_{LOW}$ and then use the three digital control words to calculate the duty cycle 3116 according to Equation 1 above. Components for generating and processing the Sw and Xor digital signals are described in further detail below.

The phase detector 3131 generates signals that are used by the digital circuit 3240 in generating the first, second, and third digital control words $OTW_{FULL}$, $OTW_{HIGH}$, and $OTW_{LOW}$. Specifically, as seen in FIG. 3, the phase detector 3131 receives (i) a reference signal that is equivalent to the periodic input signal 3002 at an input "C" (e.g., a clock input), and (ii) a delayed version of the periodic input signal 3002 from the delay train 3134 at an input "D" (e.g., a data input). The phase detector 3131 determines when edges (e.g., rising edges, falling edges, as described above) of the received signals are aligned and generates the first, second, and third digital control words $OTW_{FULL}$, $OTW_{HIGH}$, and $OTW_{LOW}$ based on the alignment of these signals. This is described above with reference to FIGS. 2a, 2b, and 2c and in further detail below.

To generate the first digital control word $OTW_{FULL}$ that causes the periodic input signal 3002 to be delayed the first amount of time, a divider 3111 and XOR gate 3113 are utilized, among other components. The divider 3111 divides the periodic input signal 3002 by two (2) to generate a slower, divided version of the periodic input signal. The divided version of the periodic input signal and the undivided periodic input signal 3002 are received at inputs of a multiplexer 3112, which selects one of the two received signals and propagates the selected signal.

The XOR gate 3113 (i) functions as an inverter when the Xor signal is equal to a first value (e.g., 1'b1), and (ii) does not invert a received input signal when the Xor signal is equal to a second value (e.g., 1'b0). Accordingly, when the multiplexer 3112 propagates the divided version of the periodic input signal and the XOR gate 3113 inverts that divided signal, the output of the XOR gate 3113 (e.g., circuit 3120) is a divided, inverted version of the periodic input signal, similar to the waveform 1301 described above with reference to FIG. 2A. In some embodiments, both the periodic input signal 3002 and the divided, inverted version of it are received at delay line and phase detector module 3130. The phase detector 3131 determines when edges of the periodic input signal 3002 and the divided, inverted version of the periodic input signal are aligned, where the alignment of the edges indicates that the periodic input signal 3002 has been delayed the first amount of time, as described above with reference to FIG. 2A. An output of the phase detector 3131 is coupled to the digital circuit 3240, thus providing a feedback loop that enables the digital circuit 3240 to modify the first digital control word $OTW_{FULL}$ until the periodic input signal 3002 has been delayed the first amount of time.

To generate the second digital control word $OTW_{HIGH}$ that causes the periodic input signal 3002 to be delayed the second amount of time, the XOR gate 3113 is utilized, among other components. As explained above, the XOR gate 3113 functions as an inverter when the Xor signal is equal to the first value. Accordingly, when the multiplexer 3112 propagates the periodic input signal 3002 and the XOR gate 3113 inverts that signal, the output of the XOR gate 3113 is an inverted version of the periodic input signal 3002, similar to the waveform 1101 described above with reference to FIG. 2B. In some embodiments, both the periodic input signal 3002 and the inverted version of it are received at the delay line and phase detector module 3130. The phase detector 3131 determines when edges of the periodic input signal 3002 and the inverted version of the periodic input signal are aligned, where the alignment of the edges indicates that the periodic input signal 3002 has been delayed the second amount of time, as described above with reference to FIG. 2B. The output of the phase detector 3131 is coupled to the digital circuit 3240, and this provides a feedback loop that enables the digital circuit 3240 to modify the second digital control word $OTW_{HIGH}$ until the periodic input signal 3002 has been delayed the second amount of time.

To generate the third digital control word $OTW_{LOW}$ that causes the periodic input signal 3002 to be delayed the third amount of time, the XOR gate 3113 is again utilized as an inverter, among other components. Specifically, in some embodiments, the XOR gate 3113 is used to propagate (i) a first waveform representative of an inverted version of the periodic input signal 3002 (e.g., waveform 1202 shown in FIG. 2C), and (ii) a second waveform representative of an inverted version of the first waveform (e.g., waveform 1201 shown in FIG. 2C). The propagated signals are received at the delay line and phase detector module 3130. The phase detector 3131 determines when edges of the periodic input signal 3002 and the inverted version of the periodic input signal are aligned, where the alignment of the edges indicates that the periodic input signal 3002 has been delayed the third amount of time, as described above with reference to FIG. 2C. The output of the phase detector 3131 is coupled to the digital circuit 3240, and this provides a feedback loop that enables the digital circuit 3240 to modify the third digital control word $OTW_{LOW}$ until the periodic input signal 3002 has been delayed the third amount of time.

In the circuit of FIG. 3, a controller 3230 receives the digital control words from the digital circuit 3240 and determines the duty cycle 3116 based on the first, second, and third digital control words $OTW_{FULL}$, $OTW_{HIGH}$, $OTW_{LOW}$. In some embodiments, the controller 3230 determines the duty cycle 3116 by solving Equation 1, as detailed above.

Along with the features described above, the circuit of FIG. 3 also includes an analog block 3100 and a digital block 3200 that are electrically connected to each other. The analog block 3100 includes a selection module 3110 and the aforementioned delay line and phase detector module 3130, which are electrically connected to each other as seen in FIG. 3. The delay line and phase detector module 3130 includes the delay train 3134 and phase detector 3130 described above. In some embodiments, the phase detector 3130 is implemented using a sensed amplifier flip flop (SAFF).

In FIG. 3, the digital block 3200 includes a two-bit counter 3210, a reset block 3250 for generating reset signals, the digital circuit 3240, and the controller 3230 for calculating the duty cycle 3116. In some embodiments, the reset block 3250 is implemented as a part of the controller 3230. The digital block 3200 also includes a clock generation module 3220 for generating a system clock $f_{sys}$ that is utilized as a timing signal by the digital circuit 3240, controller 3230, and reset block 3250. In some embodiments, the clock generation module 3220 generates the system clock $f_{sys}$ by dividing the periodic input signal 3002 using a divider 3221 that divides by sixteen (16). Accordingly, the system clock $f_{sys}$ is slower than the periodic input signal 3002 due to the division. A retime block 3222 of the digital block 3200 re-samples the output of the phase detector 3131 to avoid meta problems.

The selection module 3110 of the analog block 3100 includes divider 3111, multiplexer 3112, XOR gate 3113, and two D flip flops 3114, 3115. In the analog block 3100, the periodic input signal 3002 is received by the divider 3111 and a first input pin of the multiplexer 3112. An output of the divider 3111 is electrically connected to a second input pin of the multiplexer 3112, and a control pin of the multiplexer 3112 for determining the multiplexer's selection is connected to an output of the D flip flop 3114. Further, the output of the multiplexer 3112 is connected to a first input of the XOR gate 3113, and an output of the D flip flop 3115 is connected to a second input of the XOR gate 3113.

In FIG. 3, the output of the selection module 3110 is the output of the XOR gate 3113, and this output is received as an input at the delay train 3134. The delay train 3134 includes a programmable delay line 3132 and an inverter 3133. The programmable delay line 3132 is controlled by the digital block 3200 and in particular the digital circuit 3240 that generates the digital control words. The inverter 3133 is used to invert the output of the selection module 3110. As seen in FIG. 3, an output of the programmable delay line 3132 connects to the input labeled "D" (e.g., data input) of the phase detector 3131, and an output of the inverter 3133 connects to the input labeled "C" (e.g., clock input) of the phase detector 3131. An output of the phase detector 3131 is electrically connected to the digital block 3200 to provide phase information as described herein. In some embodiments, the output of the phase detector 3131 connects to a D flip flop 3222 of the digital block 3200 to enable retiming of the phase information by the system clock $f_{sys}$.

The 2-bit counter 3210 generates three distinct outputs (e.g., 2'b00, 2'b01 and 2'b10), which are used to control the selection module 3110 for generating three patterns. The combination of the selection module 3110 and the 2-bit counter 3210 may be understood as making up a pattern generator module 4000, as labeled in FIG. 4. As described above, the digital circuit 3240 traces the period of the periodic input signal 3002 by increasing or decreasing the digital control word OTW based on the output from the phase detector 3131. In some embodiments, the period trace is completed when the output of the phase detector 3131 toggles between 1 and 0, at which point the digital circuit 3240 outputs a locking signal LD.

The locking signal LD is received by D flip flops 3232, 3233, which sample the LD signal twice. In some embodiments, the first sampling turns the locking signal LD into a strobe clock $f_{STROBE}$, and the second sampling turns the locking signal LD into a triggering event to trigger the reset block 3250 and the 2-bit counter 3210. The strobe clock $f_{STROBE}$ drives the D flip flops 3232, 3233 to store the digital control word generated by the digital circuit 3240 and divide-by-3 block 3231. In some embodiments, another strobe clock $f_{STROBE\_DIV3}$ generated by the divide-by-3 block 3231 is used by the controller 3230 to latch the three digital control words $OTW_{FULL}$, $OTW_{HIGH}$ and $OTW_{LOW}$.

As explained above, the second sampling of the locking signal LD turns the signal LD into a triggering event to trigger the reset block 3250 and the 2-bit counter 3210. The triggering event has one clock latency compared to $f_{STROBE}$, and as a result, the reset block 3250 sends a reset signal to the digital circuit 3240 after finishing the storage of the digital control words from the digital circuit 3240. The triggering event also drives the 2-bit counter 3210 for changing the output state. In some embodiments, the three outputs of the 2-bit counter 3210 represent high period measurement in 2'b00, low period measurement in 2'b01, and full period measurement in 2'b10.

In the embodiment of FIG. 3, the controller 3230 determines that the measurement is completed by receiving the locking signal LD having a high level and then turning the locking signal LD to the strobe clock $f_{STROBE}$. As explained above, the strobe clock $f_{STROBE}$ triggers D flip flops 3232,

3233 to latch the digital control words OTW and drives the divide-by-3 block 3231 to generate the strobe clock $f_{STROBE\_DIV3}$. The strobe clock $f_{STROBE}$ also drives the reset block 3250 and pattern generator module 4000. The reset block 3250 sends a reset signal to the digital circuit 3240 to restart period tracking, and the pattern generator module 4000 changes the measured pattern for new period tracking. In some embodiments, the strobe clock $f_{STROBE\_DIV3}$ drives the D flip flops 3237, 3238, and 3239 to latch the three different digital control words $OTW_{FULL}$, $OTW_{HIGH}$, $OTW_{LOW}$, which are generated by executing three patterns. The latched digital control words $OTW_{FULL}$, $OTW_{HIGH}$, $OTW_{LOW}$ are used by the controller 3230 for generating the duty cycle 3116 according to Equation 1.

Figure 4:
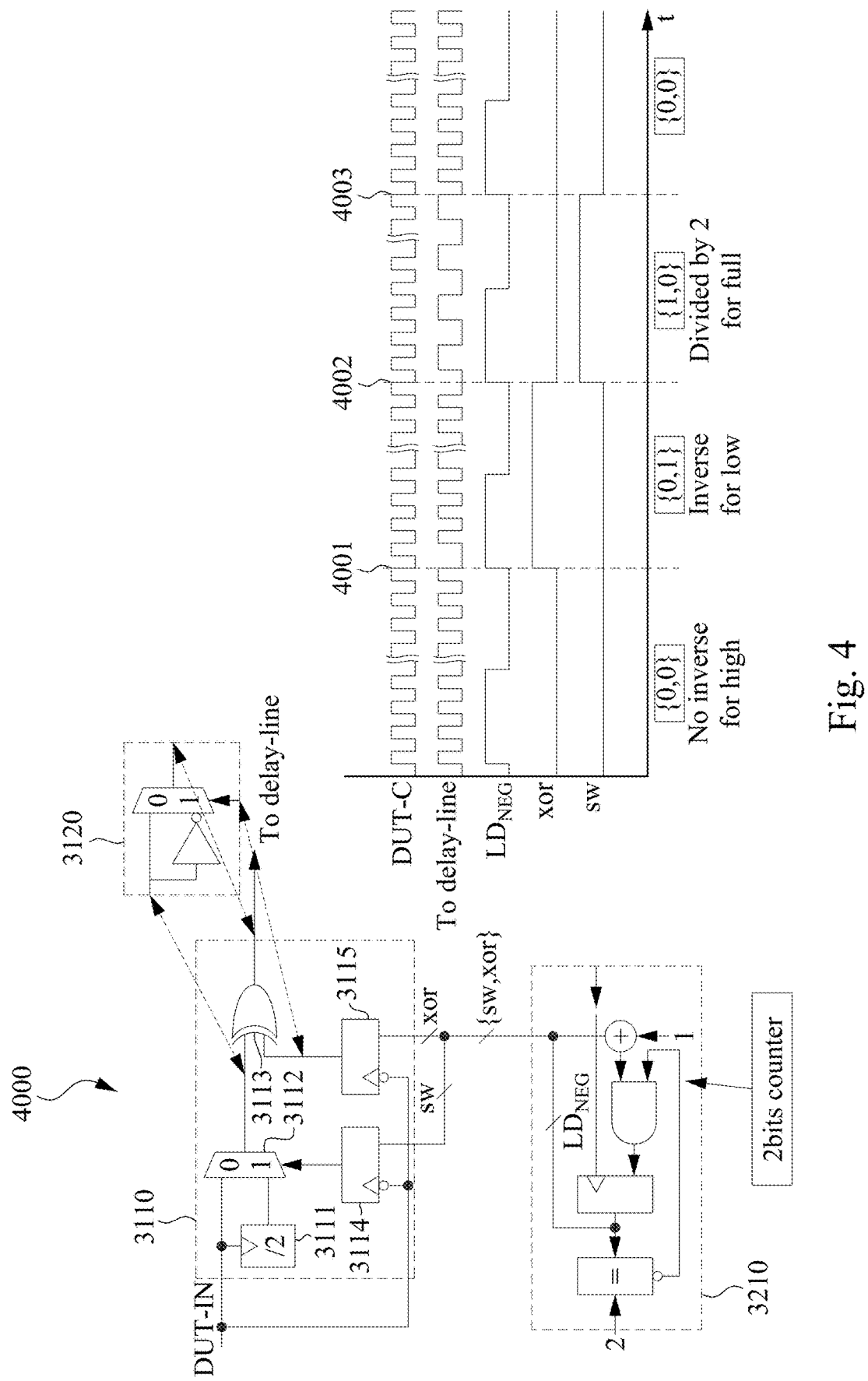
FIG. 4 depicts a schematic diagram illustrating a pattern generator module with selection module and 2-bit counter used to measure high, low, and full periods of a periodic input signal, in accordance with some embodiments.

FIG. 4 is a schematic diagram illustrating the pattern generator module 4000 with selection module 3110 and 2-bit counter 3210 used to measure high, low, and full periods of the periodic input signal 3002, according to some embodiments. The switchovers of high, low, and full are controlled by the pattern generator module 4000, which is driven by the locking signal LD generated by the digital circuit 3240. As explained above, the selection module 3110 includes the divider 3111, multiplexer 3112, XOR gate 3113, and two D flip flops 3114, 3115. The XOR gate 3113 provides a non-inverted clock when xor=1'b0 and an inverted clock when xor=1'b1. The divider 3111 is implemented to measure the "full" period with xor=1'b0 and sw=1'b1. According to some embodiments, all switching signals (e.g., Sw and Xor) are resampled by falling edge clocks 4001, 4002, and 4003 to avoid clock glitch.

In some embodiments, the 2-bit counter 3210 generates three states: 2b'00, 2'b01 and 2'b10. The MSB (most significant bit) of 2-bit output is denoted "Sw," and the LSB (least significant bit) is denoted "Xor." According to some embodiments, the signal Xor controls the XOR-gate 3113 to either invert the periodic input signal 3002 or not (e.g., "1" means to invert the periodic input signal 3002, and "0" means to propagate the periodic input signal 3002 without inversion). According to some embodiments, the signal Sw controls the multiplexer 3112 to choose either the periodic input signal 3002 or the version of the periodic input signal 3002 that has been divided by two (2), as generated by divider 3111.

Figure 5:
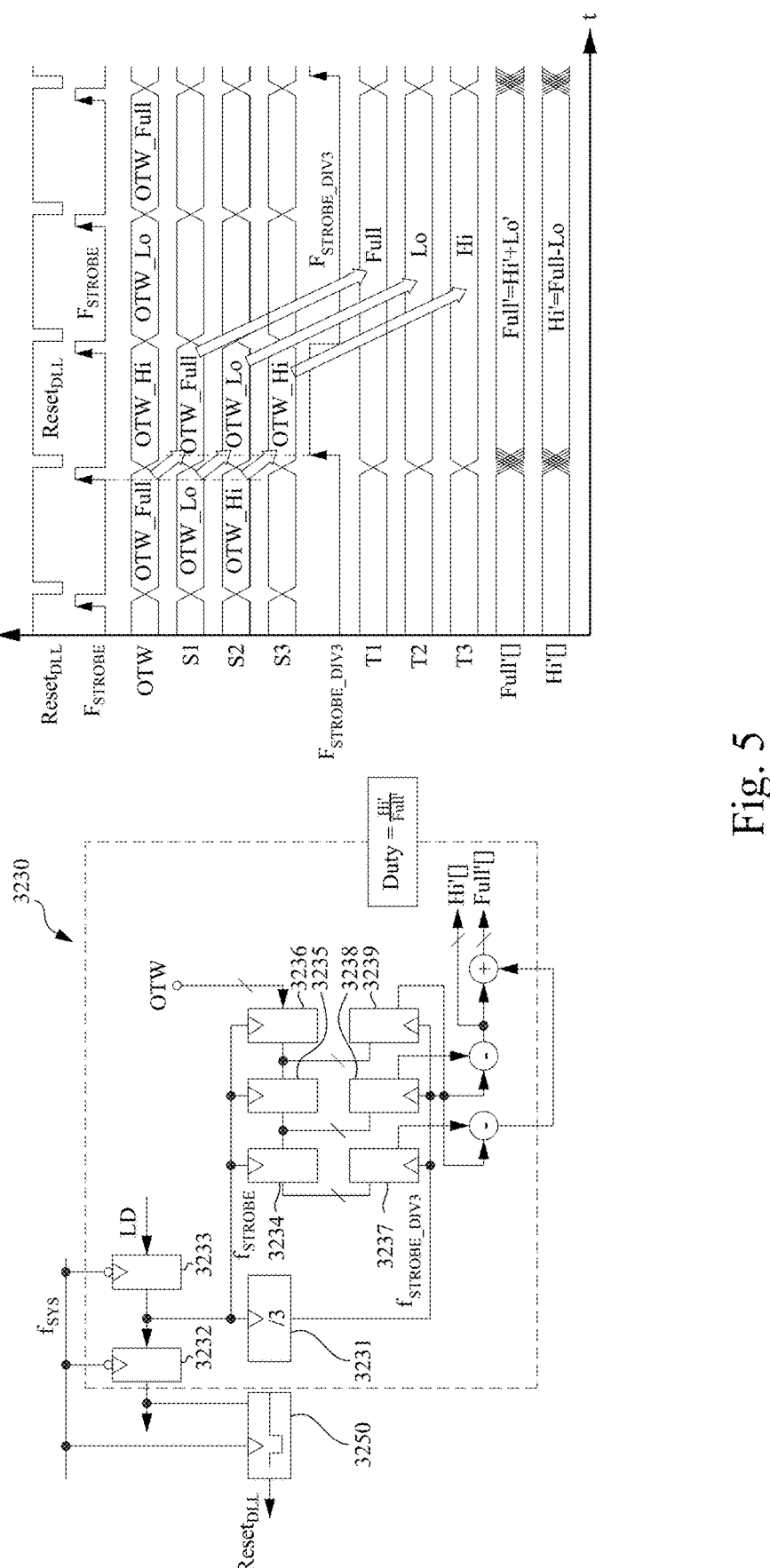
FIG. 5 depicts a schematic diagram illustrating a data strobe and period calculation module, in accordance with some embodiments.

FIG. 5 is a schematic diagram illustrating a data strobe and period calculation module, according to some embodiments. The controller 3230 includes first and second D flip flops 3232, 3233 as shown in FIGS. 3 and 5. Both of the D flip flops 3232, 3233 receive the system clock $f_{sys}$ from the clock generation module 3220, which divides the periodic input signal 3002 by 16 using the divider 3231. The D flip flop 3233 receives the locking signal LD from the controller 3230, and the D flip flop 3232 transmits the locking signal LD with a second retime ($LD_{NEG}$) to the two-bit counter 3210. In some embodiments, the D flip flops 3234, 3235, and 3236 are connected together to supply $f_{STROBE}$ to the divider 3231, which divides $f_{STROBE}$ by three to provide $f_{STROBE\_DIV3}$ to D flip flops 3237, 3238, and 3239.

In some embodiments, the locking signal LD from the digital circuit 3240 is resampled by the system clock $f_{SYS}$ at a falling edge to generate the strobe clock $f_{STROBE}$ used in capturing the digital control words $OTW_{FULL}$, $OTW_{HIGH}$, and $OTW_{LOW}$. The reset block 3250 is triggered by the locking signal LD via a second sampling that is required to reset the digital circuit 3240 for a new period measurement. One additional cycle delay, however, can ensure that the digital control word data is stored before the reset of digital circuit 3240. In some embodiments, the first sampling of $OTW_{FULL}$, $OTW_{HIGH}$, and $OTW_{LOW}$ via $f_{STROBE}$ is captured by a low-speed clock (where $f_{STROBE\_DIV3}$ is $f_{STROBE}$ divided by 3) for the calculation of the final period of Hi' and Full' free of PVT artifact fluctuations.

Figure 6:
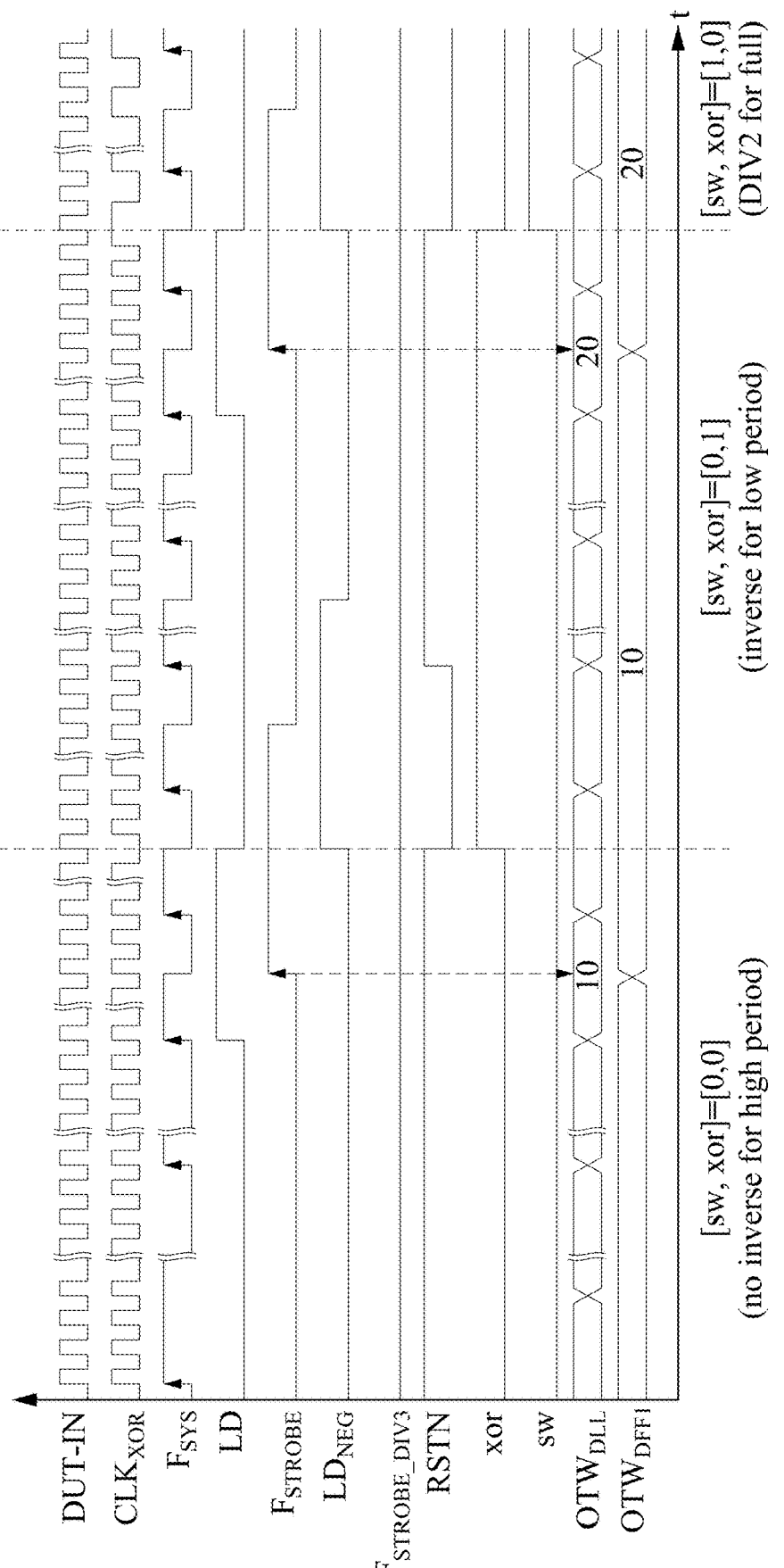
FIG. 6 depicts a timing diagram illustrating a measurement of high, low, and full periods of a periodic input signal, in accordance with some embodiments.

FIG. 6 is a timing diagram illustrating a measurement of high, low, and full periods of the periodic input signal 3002, according to some embodiments. In some embodiments, the system clock $f_{SYS}$ of the digital block 3200 is the periodic input signal 3002 divided by 16 to enable lower digital power consumption. The locking signal LD that is sampled by the falling edge of $f_{SYS}$ becomes the strobe clock to capture the digital control word generated by the digital circuit 3240 (labeled $OTW_{DLL}$ in FIG. 6). The locking signal LD with a second retime (labeled $LD_{NEG}$ in FIG. 6) triggers the reset block 3250 to reset the digital circuit 3240 and change the pattern of [Sw, Xor]. In some embodiments, when the pattern of [Sw, Xor] changes from [0,0] to [1,0], the measurements of high/low/full periods are completed by changing pattern of [Sw, Xor] from [0,0] to [1,0].

Example sequences of timing diagrams are illustrated in FIG. 6. According to some embodiments, the state of "Sw" and "Xor" starts from 2'b00, and the periodic input signal 3002 is propagated directly through the selection module 3110 to the delay train 3134. The digital circuit 3240 releases the locking signal LD having a high level for completing period tracking. The $f_{STROBE}$ drives D flip flops 3232, 3233 to store the digital control word for the high period. The 2-bit counter 3210 increases value from 2'b00 to 2'b01 to turn the state of "Sw" and "Xor" to 2'b01. The reset block 3250 sends a reset signal to the digital circuit 3240 to turn locking signal LD to low and restart period tracking. In some embodiments, the state of "Sw" and "Xor" becomes 2'b01. The selection module 3110 inverts the periodic input signal 3002 and outputs it to the delay train 3134. The locking signal LD of the digital circuit 3240 becomes high again to drive D flip flops 3232, 3233 of the controller 3230 to store the digital control word $OTW_{LOW}$ for low period.

Reset block 3250 sends a signal to the digital circuit 3240 to drop down the locking signal LD and restart period tracking, and the 2-bit counter 3210 changes state to 2'b10 from 2'b01. In some embodiments, the state of "Sw" and "Xor" becomes 2'b10, and the periodic input signal 3002 is provided to the divider 3111. The digital circuit 3240 implements the same procedure as discussed above to complete period tracking and generate "H" in the locking signal LD. The $f_{STROBE}$ drives D flip flops 3232, 3233 to store $OTW_{FULL}$, and the rising edge of $f_{STROBE\_DIV3}$ drives the D flip flops 3237, 3238, and 3239 to latch the three different digital control words OTW (e.g., $OTW_{FULL}$, $OTW_{HIGH}$, $OTW_{LOW}$, as described herein). These control words are used in calculating the duty cycle and step size $\Delta T$. According to some embodiments, the 2-bit counter 3210 receives trigger event to change the state from 2'b10 to 2b'00 for the calculation.

FIG. 7 depicts operations of an example method 7000 for determining a duty cycle of a periodic input signal, in accordance with some embodiments. FIG. 7 is described with reference to FIG. 1 above for ease of understanding. But the process of FIG. 7 is applicable to other circuits as well. At 7002, the periodic input signal (e.g., periodic input signal 102) is received at a delay circuit (e.g., delay circuit 104) configured to delay the periodic input signal based on a digital control word. At 7004, a first digital control word (e.g., $OTW_{FULL}$ 112a) used to delay the periodic input signal a first amount of time corresponding to a period of the periodic input signal is generated. At 7006, a second digital control word (e.g., $OTW_{HIGH}$ 112b used to delay the periodic input signal a second amount of time corresponding to a portion of the period that the periodic input signal has a logic-level high value is generated. At 7008, a third digital control word (e.g., $OTW_{LOW}$ 112c) used to delay the periodic input signal a third amount of time corresponding to a portion of the period that the periodic input signal has a logic-level low value. In the example of FIG. 1, the digital circuit 110 generates the first, second, and third digital control words. At 7010, the duty cycle (e.g., duty cycle 116) of the periodic input signal is determined based on the first, second, and third digital control words. In the example of FIG. 1, the controller 114 generates the duty cycle.

The present disclosure is directed to circuits, methods, and devices for determining a duty cycle of a periodic input signal. In an example method for determining a duty cycle of a periodic input signal, the periodic input signal is received at a delay circuit configured to delay the periodic input signal based on a digital control word. A first digital control word is generated, where the first digital control word is used to delay the periodic input signal a first amount of time corresponding to a period of the periodic input signal. A second digital control word is generated, where the second digital control word is used to delay the periodic input signal a second amount of time corresponding to a portion of the period that the periodic input signal has a logic-level high value. A third digital control word is generated, where the third digital control word is used to delay the periodic input signal a third amount of time corresponding to a portion of the period that the periodic input signal has a logic-level low value. The duty cycle of the periodic input signal is determined based on the first, second, and third digital control words.

An example circuit for determining a duty cycle of a periodic input signal includes a delay element configured to delay the periodic input signal based on a digital control word. A digital circuit is configured to generate a first digital control word used to delay the periodic input signal a first amount of time corresponding to a period of the periodic input signal. The digital circuit is also configured to generate a second digital control word used to delay the periodic input signal a second amount of time corresponding to a portion of the period that the periodic input signal has a logic-level high value. The digital circuit is further configured to generate a third digital control word used to delay the periodic input signal a third amount of time corresponding to a portion of the period that the periodic input signal has a logic-level low value. The example circuit also includes a controller configured to determine the duty cycle of the periodic input signal based on the first, second, and third digital control words.

An example circuit for determining a duty cycle of a periodic input signal includes a delay locked loop with a delay train and a phase detector. The delay locked loop being configured to receive the periodic input signal. The circuit also includes a digital circuit configured to receive an output of the phase detector indicating an alignment between the periodic input signal and a delayed version of the periodic input signal. The digital circuit is also configured to generate digital control words for controlling an amount of delay applied by the delay train. The digital control words include a first digital control word used to delay the periodic input signal a first amount of time corresponding to a period of the periodic input signal, a second digital control word used to delay the periodic input signal a second amount of time corresponding to a portion of the period that the periodic input signal has a logic-level high value, and a third digital control word used to delay the periodic input signal a third amount of time corresponding to a portion of the period that the periodic input signal has a logic-level low value. The circuit also includes a controller configured to determine the duty cycle of the periodic input signal based on the first, second, and third digital control words.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for outputting a duty cycle value of a periodic input signal, the method comprising:
dividing the periodic input signal to generate a divided version of the periodic input signal;
generating a first digital control word responsive to the divided version of the periodic input signal and used to delay the periodic input signal a first amount of time such that a duration of a high or low portion of a period of a first delayed version of the periodic input signal is substantially equal to a total duration of high and low portions of a period of the periodic input signal;
generating a second digital control word used to delay the periodic input signal a second amount of time corresponding to a portion of the period that the periodic input signal has a logic-level high value; and
outputting a value of a duty cycle of the periodic input signal that is based on the first digital control word and the second digital control word.

2. The method of claim 1, further comprising:
dividing the periodic input signal by 2 to generate the divided version of the periodic input signal; and
using a phase detector to determine when an edge of the periodic input signal is aligned with an edge of the divided version of the periodic input signal, wherein the alignment of the edges indicates that the periodic input signal has been delayed the first amount of time.

3. The method of claim 1, further comprising:
generating a third digital control word used to delay the periodic input signal a third amount of time corresponding to a portion of the period that the periodic input signal has a logic-level low value;
calculating the value of the duty cycle of the periodic input signal based on the first, second, and third digital control words, wherein calculating the value of the duty cycle comprises:
solving an equation $$\frac{OTW_{FULL} - OTW_{LOW}}{2 \times OTW_{FULL} - OTW_{HIGH} - OTW_{LOW}},$$

where $OTW_{FULL}$ represents the first digital control word, $OTW_{HIGH}$ represents the second digital control word, and $OTW_{LOW}$ represents the third digital control word; and
outputting the calculated duty cycle value.

4. The method of claim 3, further comprising:
generating an inverted version of the periodic input signal; and
using a phase detector to determine when an edge of the periodic input signal is aligned with an edge of the inverted version of the periodic input signal, wherein the alignment of the edges indicates that the periodic input signal has been delayed the second amount of time.

5. The method of claim 3, further comprising:
inverting the periodic input signal to generate a second signal;
generating an inverted version of the second signal; and
using a phase detector to determine when an edge of the second signal is aligned with an edge of the inverted version of the second signal, wherein the alignment of the edges indicates that the periodic input signal has been delayed the third amount of time.

6. The method of claim 3, further comprising:
receiving the periodic input signal at a delay circuit configured to delay the periodic input signal based on a digital control word, wherein the delay circuit is configured to delay the periodic input signal based on a step size representing a minimum amount of delay that can be applied by the delay circuit;
after determining the duty cycle, using the duty cycle and the first, second, and third digital control words to determine the step size.

7. The method of claim 6, wherein:
in the step of receiving the periodic input signal, receiving the digital control word;
in the step of generating the first digital control word, wherein generating the first digital control word includes generating a waveform that is a slower version of the periodic input signal and aligning an edge of the periodic input signal and an edge of the waveform;
in the step of calculating the value of the duty cycle of the periodic input signal, calculating times the periodic input signal is in high and low states based on the first, second, and third digital control words; and
in the step of outputting the calculated duty cycle value, outputting the calculated times.

8. The method of claim 6, wherein using the duty cycle and the first, second, and third digital control words to determine the step size comprises:
solving an equation $$\frac{1}{F_{DUT} \times (2 \times OTW_{FULL} - OTW_{HIGH} - OTW_{LOW})},$$

where $F_{DUT}$ represents a frequency corresponding to the duty cycle, $OTW_{FULL}$ represents the first digital control word, $OTW_{HIGH}$ represents the second digital control word, and $OTW_{LOW}$ represents the third digital control word.

9. A circuit comprising:
a digital circuit configured to:
generate a first digital control word used to delay a periodic input signal a first amount of time such that a duration of a high or low portion of a period of a first delayed version of the periodic input signal is substantially equal to a total duration of high and low portions of a period of the periodic input signal; and
generate a second digital control word used to delay the periodic input signal a second amount of time corresponding to a portion of the period that the periodic input signal has a logic-level high value;

a delay element configured to generate a second delayed version of the periodic input signal such that a duration of a low portion of the second delayed version of the periodic input signal is substantially equal to a duration of a high portion of the periodic input signal; and a controller configured to calculate a value of a duty cycle of the periodic input signal based on the first and second digital control words.

10. The circuit of claim 9, wherein the digital circuit is further configured to generate a third digital control word used to delay the periodic input signal a third amount of time corresponding to a portion of the period that the periodic input signal has a logic-level low value;

wherein the controller is further configured to calculate the value of the duty cycle of the periodic input signal based on the first, second, and third digital control words and to output the duty cycle value calculated thereby, wherein the controller calculating the value of the duty cycle by solving an equation $$\frac{OTW_{FULL} - OTW_{LOW}}{2 \times OTW_{FULL} - OTW_{HIGH} - OTW_{LOW}},$$

where $OTW_{FULL}$ represents the first digital control word, $OTW_{HIGH}$ represents the second digital control word, and $OTW_{LOW}$ represents the third digital control word.

11. The circuit of claim 10, wherein the delay element is configured to delay the periodic input signal based on a step size representing a minimum amount of delay that can be applied by the delay element, and the controller is configured to determine the step size based on the duty cycle and the first, second, and third digital control words.

12. The circuit of claim 11, wherein the delay element is configured to receive the periodic input signal and the second digital control word and to generate the second delayed version of the periodic input signal, wherein said low portion of the second delayed version of the periodic input signal is aligned with said high portion of the periodic input signal.

13. The circuit of claim 11, wherein the delay element is configured to receive the periodic input signal and the third digital control word and to generate a third delayed version of the periodic input signal such that a duration of a high portion of the third delayed version of the periodic input signal is substantially equal to a duration of a low portion of the periodic input signal, wherein said high portion of the third delayed version of the periodic input signal is aligned with said low portion of the periodic input signal.

14. The circuit of claim 11, wherein the controller determines the step size by solving an equation $$\frac{1}{F_{DUT} \times (2 \times OTW_{FULL} - OTW_{HIGH} - OTW_{LOW})},$$

where $F_{DUT}$ represents a frequency corresponding to the duty cycle, $OTW_{FULL}$ represents the first digital control word, $OTW_{HIGH}$ represents the second digital control word, and $OTW_{LOW}$ represents the third digital control word.

15. The circuit of claim 9, further comprising:

a divider circuit configured to divide the periodic input signal by 2 to generate a divided version of the periodic input signal; and a phase detector configured to determine when an edge of the periodic input signal is aligned with an edge of the divided version of the periodic input signal, wherein the alignment of the edges indicates that the periodic input signal has been delayed the first amount of time.

16. The circuit of claim 10, further comprising:

an inverter configured to generate an inverted version of the periodic input signal; and a phase detector configured to determine when an edge of the periodic input signal is aligned with an edge of the inverted version of the periodic input signal, wherein the alignment of the edges indicates that the periodic input signal has been delayed the second amount of time.

17. The circuit of claim 10, further comprising:

one or more inverters configured to (i) invert the periodic input signal to generate a second signal, and (ii) generate an inverted version of the second signal; and a phase detector configured to determine when an edge of the second signal is aligned with an edge of the inverted version of the second signal, wherein the alignment of the edges indicates that the periodic input signal has been delayed the third amount of time.

18. A circuit comprising:

a delay locked loop configured to receive a periodic input signal;

a digital circuit configured to:

generate a first digital control word used to delay the periodic input signal a first amount of time such that a duration of a high or low portion of a period of a first delayed version of the periodic input signal is substantially equal to a total duration of high and low portions of a period of the periodic input signal; and generate a second digital control word used to delay the periodic input signal a second amount of time corresponding to a portion of the period that the periodic input signal has a logic-level high value; and a controller configured to calculate a value of a duty cycle of the periodic input signal based on the first and second digital control words.

19. The circuit of claim 18, wherein the delay locked loop includes a delay train and a phase detector, wherein the phase detector includes (i) a first input configured to receive the delayed version of the periodic input signal, and a (ii) a second input configured to receive an inverted version of the periodic input signal.

20. The circuit of claim 18, further comprising a divider configured to divide the periodic input signal to generate a second periodic signal used in determining the first digital control word.

* * * * *